United States Patent
Lin et al.

(10) Patent No.: US 7,589,354 B2
(45) Date of Patent: Sep. 15, 2009

(54) LIGHT EMITTING DIODE PACKAGE AND PROCESS OF MAKING THE SAME

(75) Inventors: Ming-Te Lin, Hsinchu (TW);
Sheng-Pan Huang, Hsinchu (TW);
Chia-Tai Kuo, Hsinchu (TW);
Chiu-Ling Chen, Hsinchu (TW);
Ya-Hui Chiang, Hsinchu (TW);
Ming-Yao Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 116 days.

(21) Appl. No.: 11/194,630

(22) Filed: Aug. 2, 2005

(65) Prior Publication Data
US 2006/0145173 A1 Jul. 6, 2006

(30) Foreign Application Priority Data
Dec. 31, 2004 (TW) .............................. 93141620 A

(51) Int. Cl.
*H01L 27/15* (2006.01)
*H01L 29/267* (2006.01)
*H01L 31/12* (2006.01)
*H01L 33/00* (2006.01)

(52) U.S. Cl. ........................................................ 257/98

(58) Field of Classification Search ............. 257/81–82, 257/98–99, 787; 438/22–29, 65; D13/180, D13/181–182; 362/362, 612, 588, 555
See application file for complete search history.

(56) References Cited

U.S. PATENT DOCUMENTS

| | | | | |
|---|---|---|---|---|
| 6,059,432 A | * | 5/2000 | Nagayama | ................... 362/507 |
| 6,071,000 A | * | 6/2000 | Rapp | .......................... 362/547 |
| 6,627,922 B1 | * | 9/2003 | Ishinaga | ..................... 257/99 |
| 6,727,643 B2 | | 4/2004 | Suehiro | |
| 7,165,896 B2 | * | 1/2007 | Hauffe et al. | .................. 385/88 |
| 7,387,400 B2 | | 6/2008 | Nakata et al. | |
| 2003/0230757 A1 | * | 12/2003 | Suehiro et al. | ................. 257/99 |
| 2004/0036081 A1 | * | 2/2004 | Okazaki | ....................... 257/99 |
| 2004/0041222 A1 | | 3/2004 | Loh | |

(Continued)

FOREIGN PATENT DOCUMENTS

JP 2003-123517 4/2003

(Continued)

OTHER PUBLICATIONS

Pierre Albou, "LED Modules for Front Lighting Applications", 2003.

(Continued)

*Primary Examiner*—Dao H Nguyen
*Assistant Examiner*—Tram H Nguyen
(74) *Attorney, Agent, or Firm*—Harness, Dickey & Pierce, P.L.C.

(57) ABSTRACT

A light emitting diode (LED) package includes at least one LED chip, a carrier, a light reflection element and at least one outside connection electrode. The LED chip is disposed on the carrier and a conductive line or a flip chip method is used to connect the electrodes of the LED chip to the external connection electrodes. A transparent material is used for fixing the light reflection element and carrier, and forming a lens.

7 Claims, 13 Drawing Sheets

U.S. PATENT DOCUMENTS

| | | | |
|---|---|---|---|
| 2004/0042212 A1 | 3/2004 | Du et al. | |
| 2004/0256630 A1* | 12/2004 | Cao | 257/98 |
| 2005/0230691 A1* | 10/2005 | Amiotti et al. | 257/79 |
| 2005/0236634 A1* | 10/2005 | Fujii | 257/94 |
| 2006/0054912 A1* | 3/2006 | Murakami et al. | 257/99 |
| 2006/0133073 A1 | 6/2006 | Nakata et al. | |
| 2007/0029569 A1* | 2/2007 | Andrews | 257/99 |
| 2007/0120135 A1* | 5/2007 | Soules et al. | 257/98 |
| 2007/0147081 A1* | 6/2007 | Choi | 362/612 |
| 2007/0290218 A1* | 12/2007 | Andrews et al. | 257/98 |

FOREIGN PATENT DOCUMENTS

| | | |
|---|---|---|
| JP | 2004-104153 | 4/2004 |
| JP | 2004-311101 | 11/2004 |
| JP | 2004-363533 | 12/2004 |
| WO | WO 2004/095590 | 11/2004 |

OTHER PUBLICATIONS

Japanese Patent Office Action dated Jun. 24, 2008.
The Office Action issued by German Patent and Trademark Office on Jan. 18, 2007.

* cited by examiner

LIGHT EMITTING DIODE PACKAGE AND PROCESS OF MAKING THE SAME

BACKGROUND

1. Field of Invention

The invention relates to a light emitting device and process of making the same, and in particular to a light emitting diode package and process of making the same.

2. Related Art

A light emitting diode (LED) is a device that is composed of semiconductor material. It is also a solid source of light for transforming electricity into light. It is not only small in size but also has desirable properties such as long span life, low driving voltage, high response speed and shock resistance, which satisfy the applications requiring the properties of small, thin and light. Therefore, the LED has already become a common product in our daily lives and turned into a mature industry.

Generally, with an LED package such as the structure shown in FIGS. 1A and 1B, a LED chip is mounted on a substrate and surrounded by transparent epoxy for emitting light up or down. The light distribution curve of the structure is shown in FIG. 1C.

There are a few reasons for the growing demand for parallel sources of light. On the one hand, the vigorous growth of the LCD device increases the growing demand for parallel sources of light. On the other hand, parallel sources of light used in headlight or tail light industries can only be produced either from the light distribution curve, which is shown in FIG. 2 by using a light shield, or by using a light distribution curve produced by lamps, lanterns and LEDs, which are disclosed in PAL 2003 Symposium by Darmstadt University of Technology (please see the attachment). However, parallel sources of light produced by the structure described above require a large sized structure, which doesn't meet economic requirements. Therefore in order to satisfy the demand for parallel sources of light, there research is being done on LED devices to produce parallel light.

For example, please refer to FIGS. 3A and 3B, which show an LED package that emits light parallel to the substrate. The technique is disclosed in U.S. Pat. No. 6,627,922. The structure disclosed in FIG. 3A includes a light reflective element 10, an LED chip 14 and a substrate 16. The light reflective element 10 has an opening 12 at one side for emitting reflected light that is produced by the LED chip 14. The structure disclosed in FIG. 3B includes a rectangular insulation substrate 1, electrodes (2 and 3), an LED chip 4, a transparent element 6 and a light reflective element 7. The light reflective element 7 only covers part of the transparent element 6, and exposes the front and two sides of the transparent element 6. Therefore, light produced by the LED chip 4 can emit in parallel form from the front of the transparent element 6.

The prior art includes the following steps: mounting an LED chip 4 on a substrate; covering a transparent material on the LED chip 4 to form a transparent element 6; and then forming a light reflective element 7 above the transparent element 6. The process used to produce such an LED structure is complicated and costly. And because the light reflective element 7 is attached or mounted on the substrate 1, it may fall off and lose function. Further, the connection between the substrate 1, transparent element 6 and light reflective element 7 only depends on the strength of binding without any structural griping. Thus it is easily separated, which limits the application of the LED package. Due to its fragile structure, this kind of LED package is only suitable for low power applications, such as low power cell phones. And due to the limitation of the size of the structure, using several LED chips for mixing light may have several disadvantages, such as poor performance, poor optical properties and difficulty of designing the reflective surface.

Therefore, there is still a need for improving the LED package used to emit parallel light, which can simplify the process, reduce cost, increase the strength of the structure and improving the light mixing performance.

SUMMARY

One objective of the invention is to provide a light emitting diode (LED) package and process of making the same, which is simple and has the advantages of low cost, high structural strength and good light mixing performance.

In order to achieve the above objective, the light emitting diode (LED) package of the invention includes: a reflective substrate having at least one reflective cup, wherein the reflective substrate bends to form a shield for covering the reflective cup; at least one LED chip, which is disposed in the reflective cup; and a transparent body or gel injection shell that covers the entire reflective substrate and the LED chip and further forms a lens in front of the LED chip.

In order to achieve the above objective, a process of making a light emitting diode (LED) package of the invention comprises the following steps: providing a reflective substrate, which has at least one reflective cup for accommodating an LED chip; stamping to form an opening in the reflective substrate; bending the reflective substrate to form a shield with a surface of the reflective substrate for covering the reflective cup; and forming a transparent body or gel injection shell that covers the entire reflective substrate and further forms a lens in front of the LED chip.

The reflective substrate can be composed of a metal material that has good ductility, such as copper. The surface of bending reflective substrate can be curved and the transparent body or gel injection shell can be composed of a transparent epoxy.

According to the manner of its application, the shield can have a receiver inside for receiving the reflected light from the bending reflective surface of the substrate.

According to the brief description above, the LED package can be attained by bending a reflective substrate to form the reflective surface, and simple and conventional processes of injection and molding are used to form the transparent body. Therefore the process is simplified and the cost can be reduced. In addition, because the reflective surface can emit light in parallel, the direction of the emitting light can be limited below a certain angle without additional light shielding. Furthermore, because the reflective surface is formed by directly bending the substrate, there is no problem of falling off the reflective surface. When this structure is used to accommodate several LEDs for light mixing, a good light mixing performance can be obtained.

Therefore, the invention can be applied to the headlight industry, taillight industry, backlight industry and DVD optical read head industry.

DETAILED DESCRIPTION

Figure 1A:
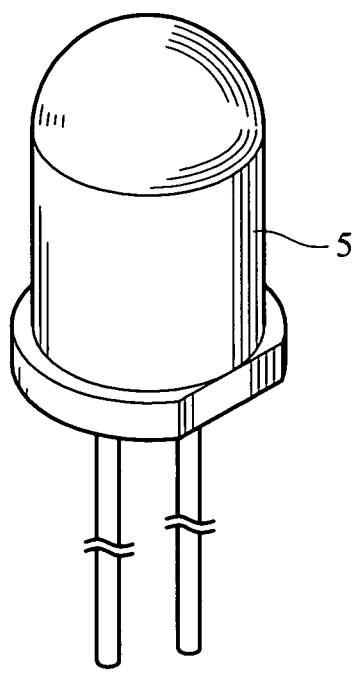
FIGS. 1A and 1B are diagrams showing a conventional LED package that emits light upward and a conventional LED package that emits light downward, respectively.
Figure 1B:
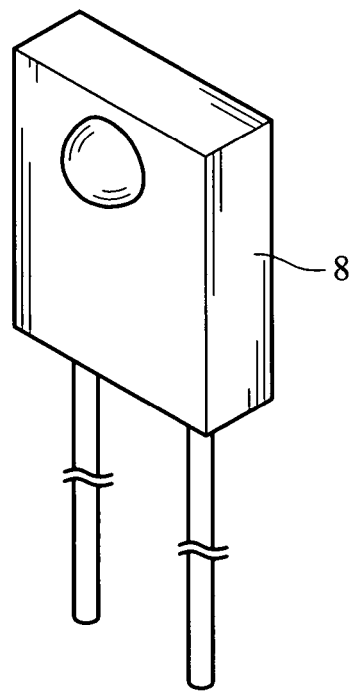
Figure 1C:
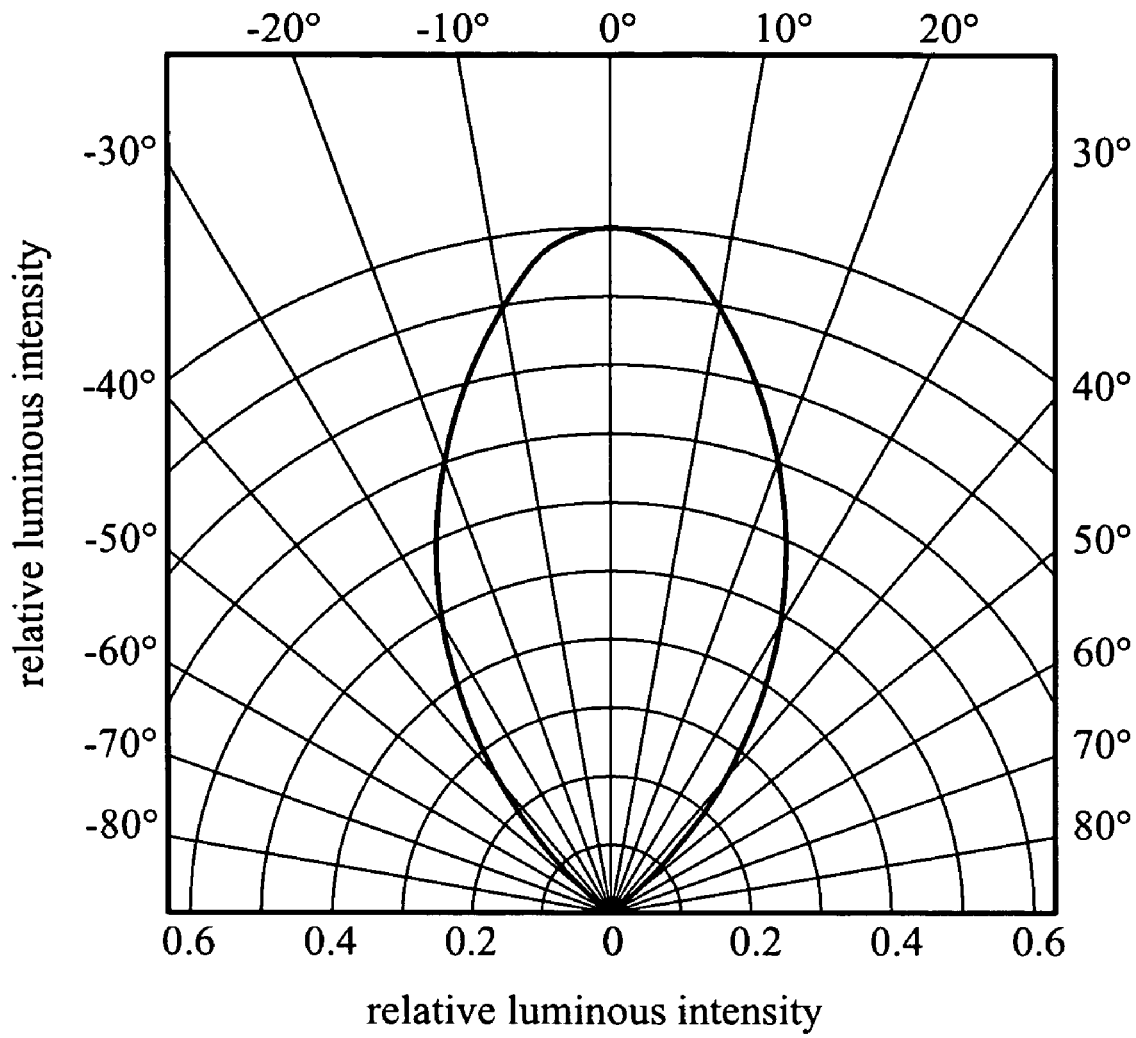
FIG. 1C is a light distribution curve of the conventional LED package, which emits light upward or downward.
Figure 2:
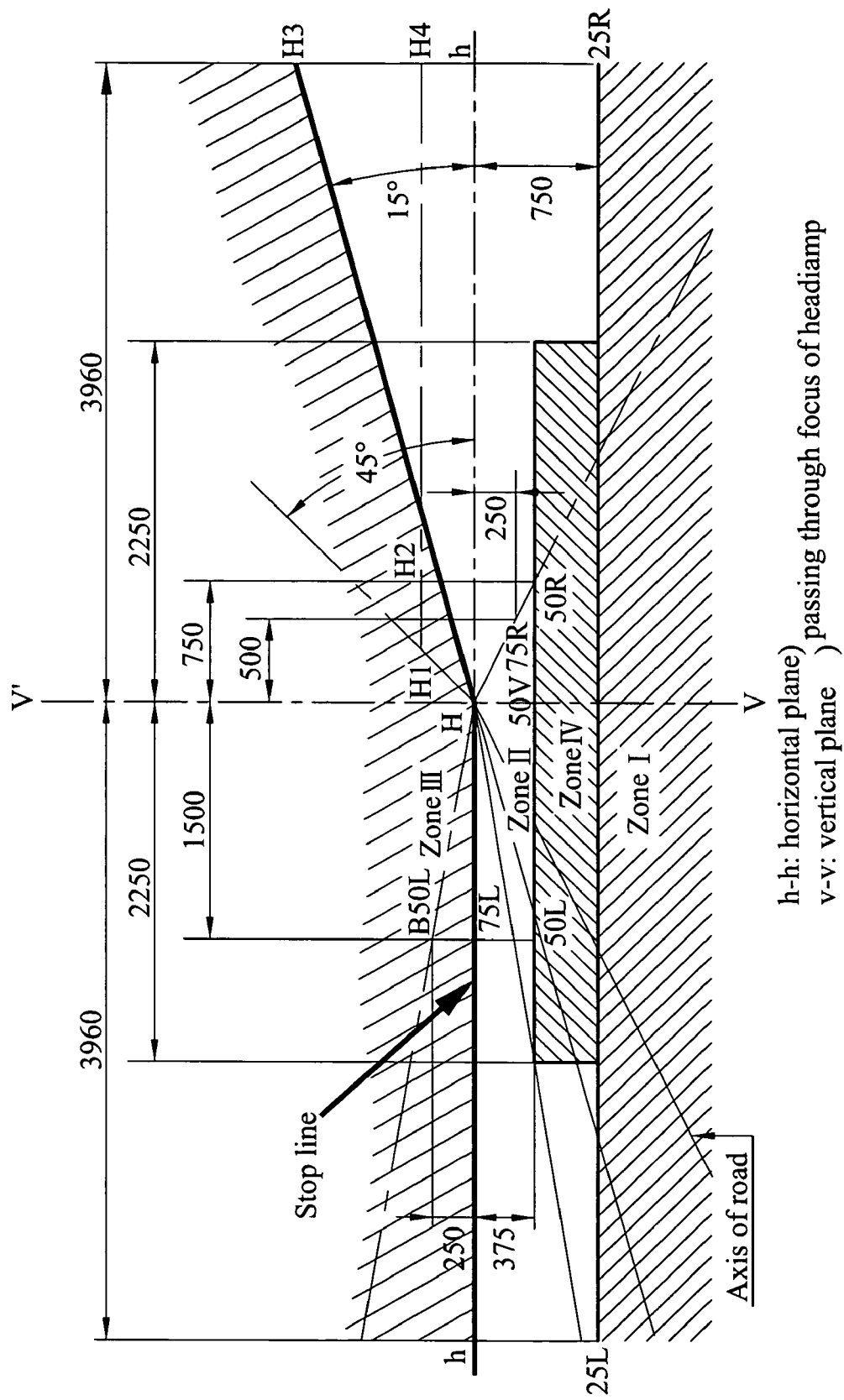
FIG. 2 is a spectacular light distribution curve of the headlight or taillight industry for producing a parallel light.
Figure 3A:
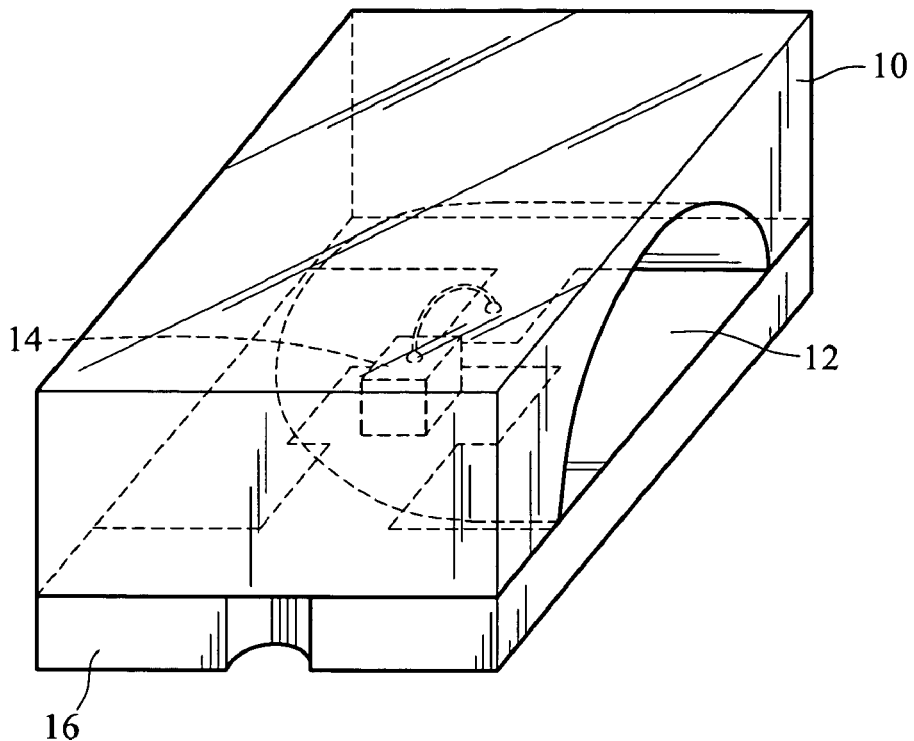
FIGS. 3A and 3B are conventional techniques disclosed in U.S. Pat. No. 6,627,922.
Figure 3B:
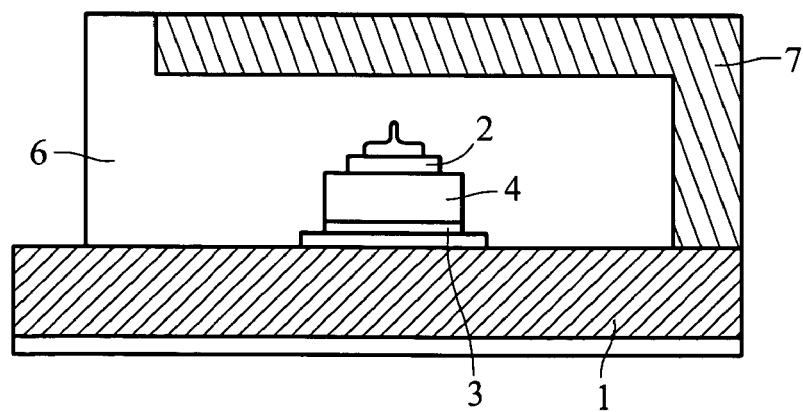
Figure 4A:
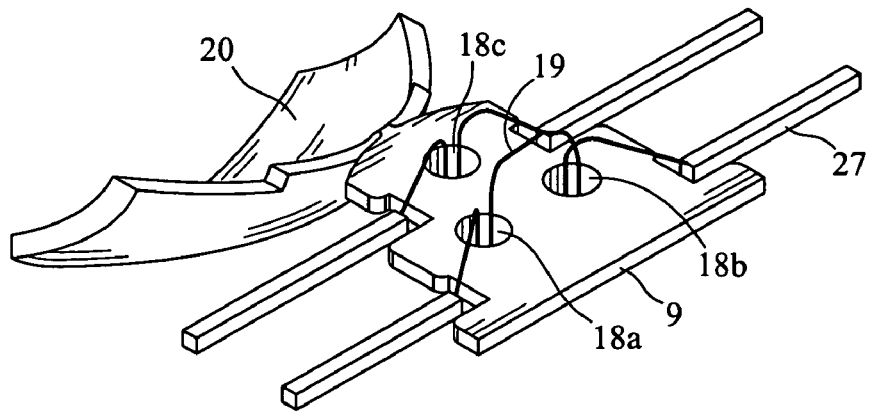
FIGS. 4A to 4C are 3D flowcharts of the first preferred embodiment of the invention.
Figure 4B:
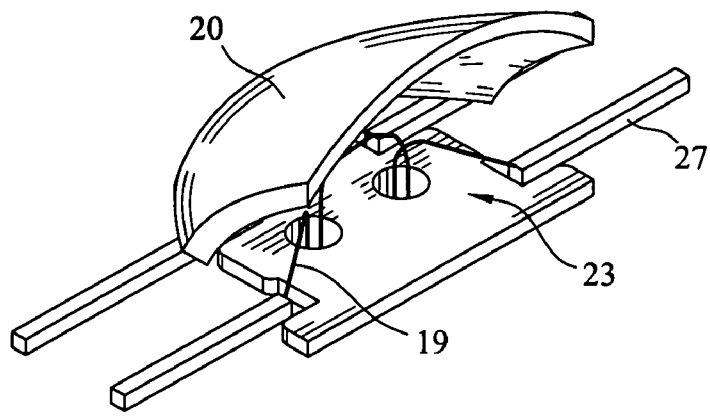
Figure 4C:
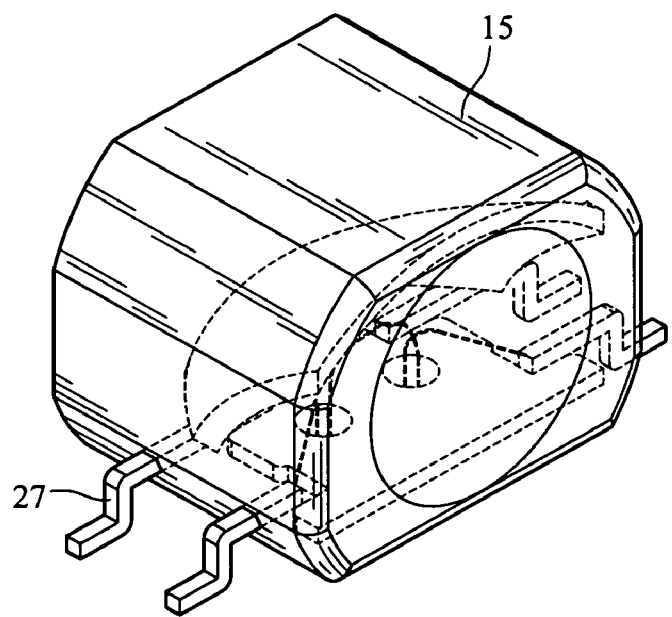
Figure 5A:
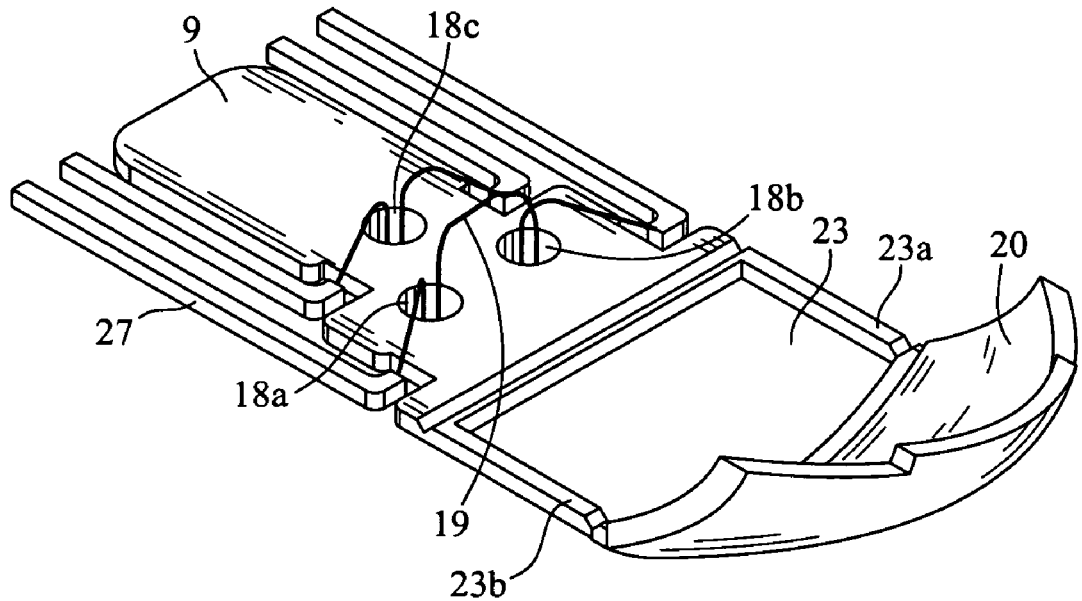
FIGS. 5A to 5D are 3D flowcharts of the second preferred embodiment of the invention.
Figure 5B:
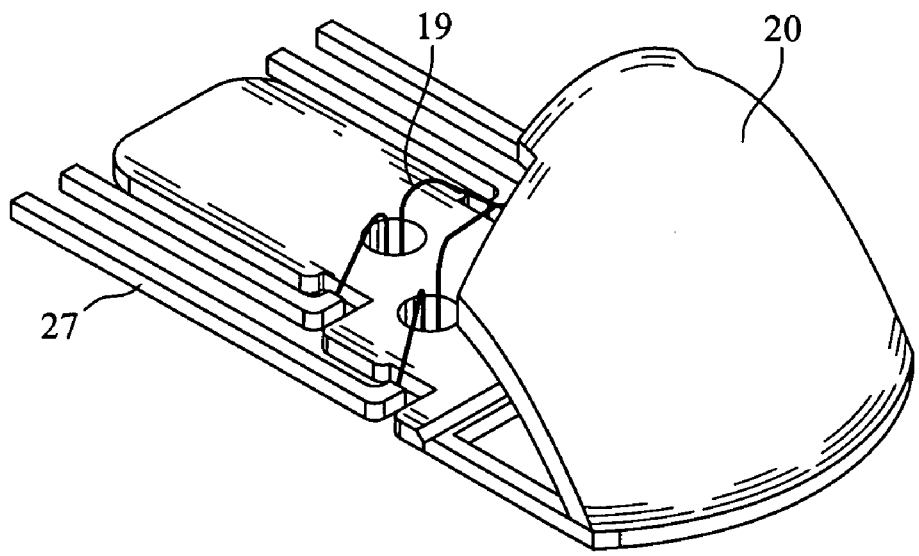
Figure 5C:
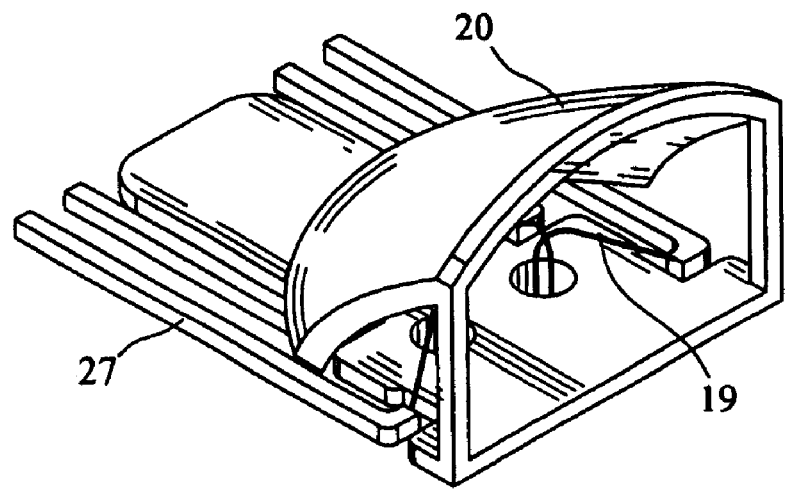
Figure 5D:
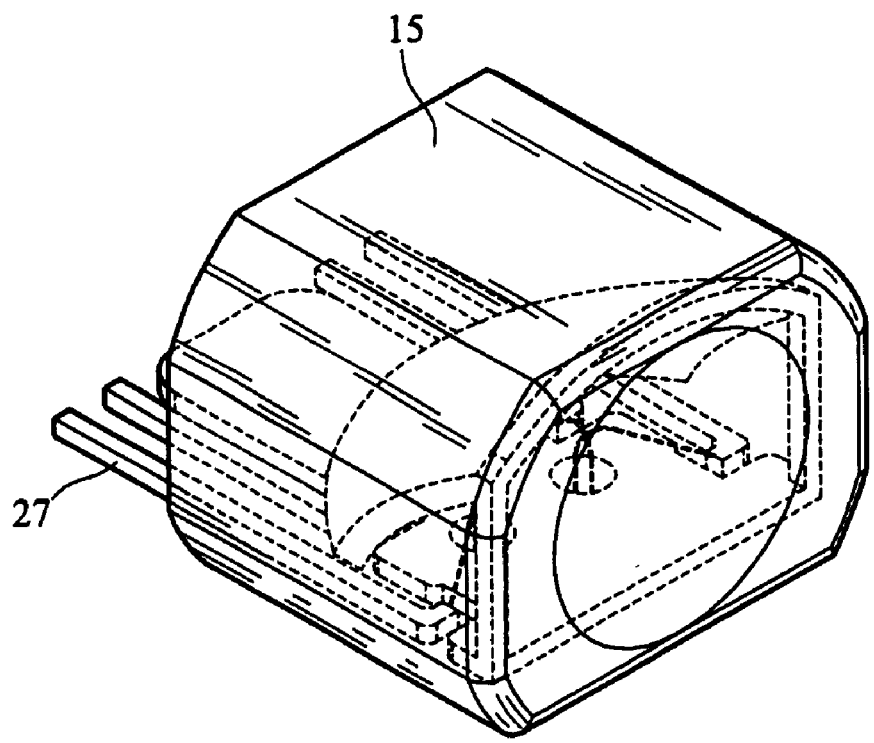

Please refer to FIGS. 4A-4C, which are 3D flowcharts of the first preferred embodiment of the invention.

The process includes the following steps. At least one LED chip (not shown in the drawings) is disposed in the reflective cups 18a, 18b and 18c of the reflective substrate 9. The reflective substrate 9 is made of metal materials such as Cu, Fe or a Cu—Fe alloy, and an injection or stamping technique is used to make the reflective substrate 9 form the reflective cups 18a, 18b and 18c, the reflective surface 20, a plurality of supporting bars 23a, 23b and the opening 23. The opening 23 is encircled by an edge of the reflective surface 20, an edge of the reflective substrate 9 and the supporting bars 23a, 23b. The acute angle is created at the connection portion between the reflective surface 20 and the reflective substrate 9. Accordingly, the reflective surface 20 and the reflective substrate 9 are integrated in one piece. The plurality of bars 23a, 23b, the reflective surface 20 and the reflective substrate 9 constitute a triangular shape. The reflective surface 20 and the opening 23 are formed at the front of the reflective substrate 9. Next, the reflective surface 20 is bent backward and close to the substrate to become a shield for covering the reflective cups 18a, 18b and 18c. An injection molding or injection gel molding process is then processed to form a transparent body or gel injection shell 15, which covers the whole reflective substrate 9, and the LED chip, and further to form a single lens in front of the opening.

The wire bonding of the LED chip connects to four electric bars for electric connection 19 to the outside. Half of the four electric bars 27 are pointed in a direction opposite that of the other half.

Please refer to FIGS. 5A-5D, which are 3D flowcharts of the second preferred embodiment of the invention.

The process includes the following steps. At least one LED chip (not shown in the drawings) is disposed in the reflective cups 18a, 18b and 18c of the reflective substrate 9. The reflective substrate 9 is made of metal materials such as Cu, Fe or a Cu—Fe alloy, and an injection or stamping technique is used to make the reflective substrate 9 form the reflective cups 18a, 18b and 18c, the reflective surface 20 and the opening 23. The reflective surface 20 and the opening 23 are formed at the front of the reflective substrate 9. Next, the reflective surface 20 is bended backward and close to the substrate to become a shield for covering the reflective cups 18a, 18b and 18c. An injection molding or injection gel molding process is then proceeded to form a transparent body or gel injection shell 15, which covers the whole reflective substrate 9 and the LED chip, and further to form a single lens in front of the opening.

The wire bonding of the LED chip connects to four electric bars for electric connection 19 to the outside. The four electric bars 27 are pointed in the same direction.

Figure 6A:
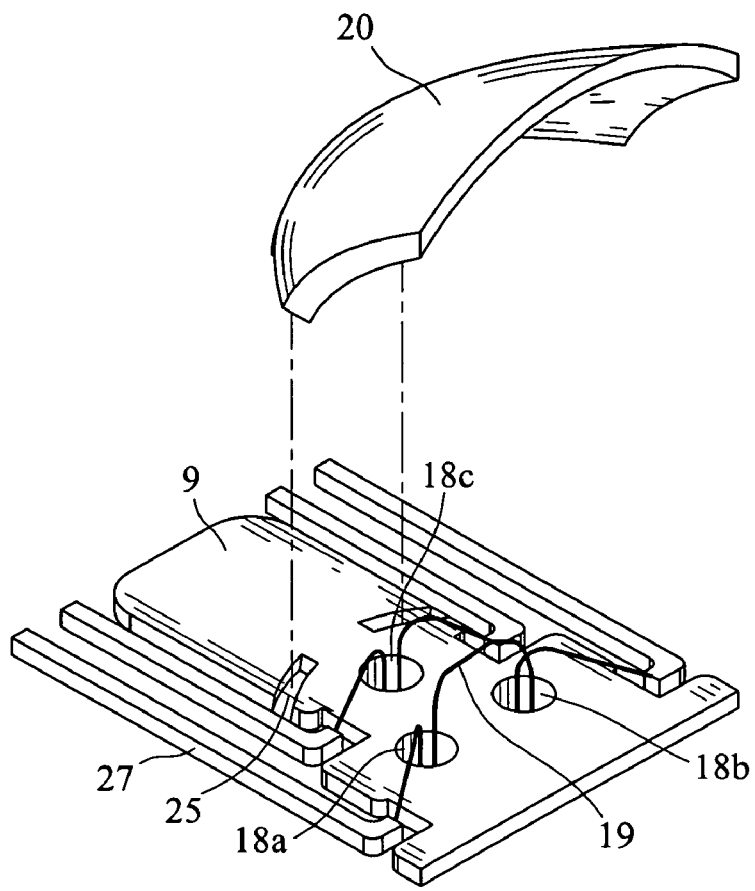
FIGS. 6A to 6C are 3D flowcharts of the third preferred embodiment of the invention.
Figure 6B:
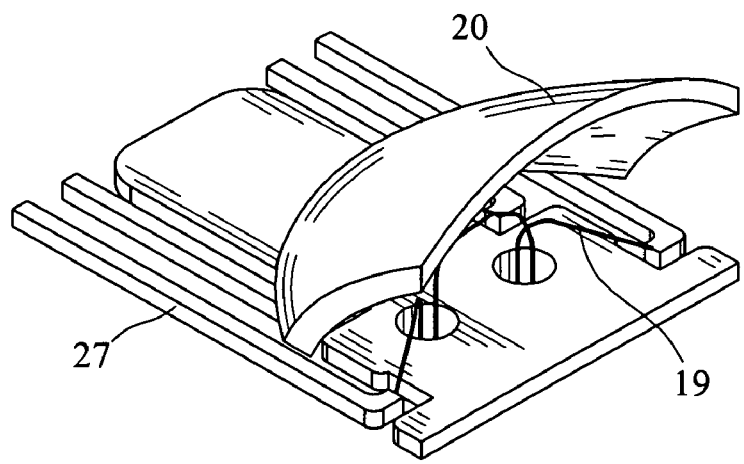
Figure 6C:
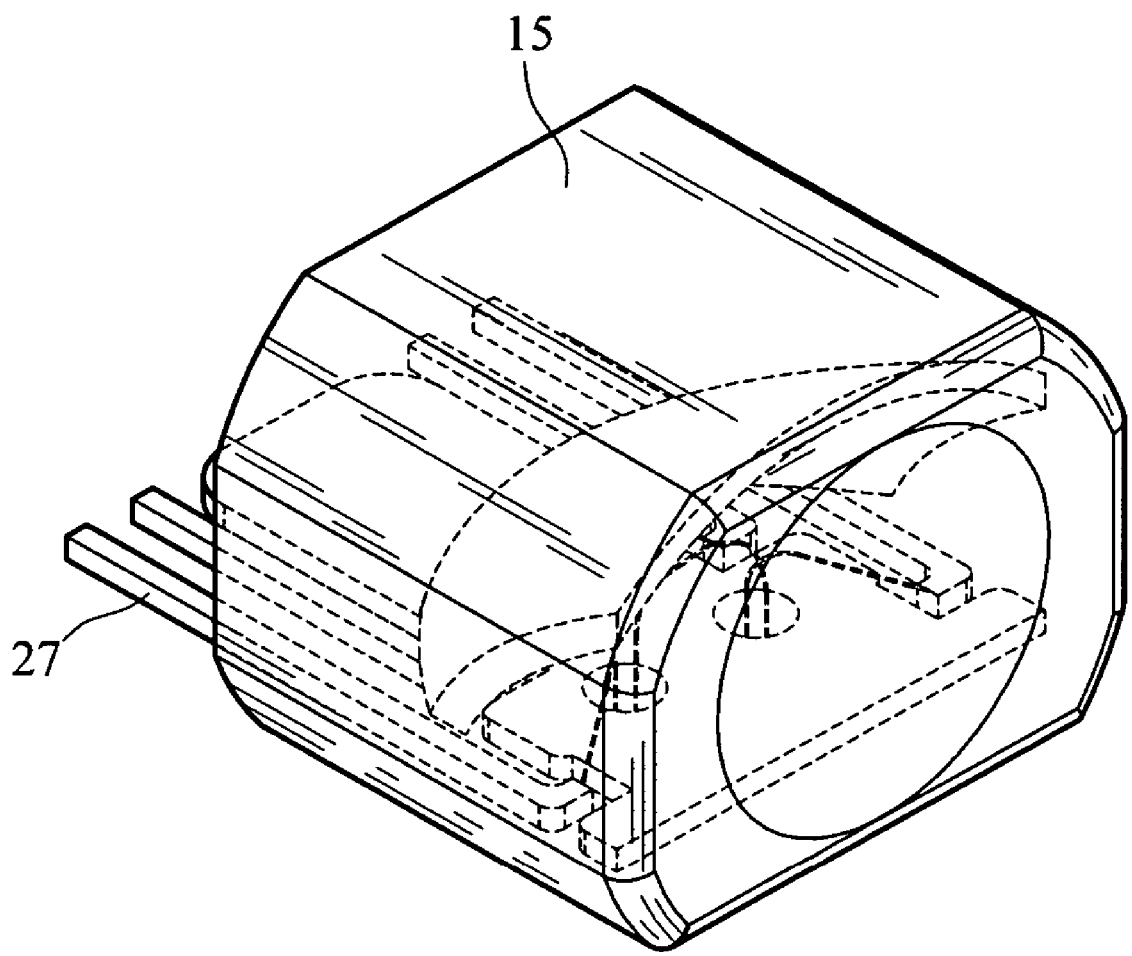

Please refer to FIGS. 6A-6C, which are 3D flowcharts of the third preferred embodiment of the invention.

The process includes the following steps. At least one LED chip (not shown in the drawings) is disposed in the reflective cups 18a, 18b and 18c of the reflective substrate 9. The reflective substrate 9 is made of metal materials such as Cu, Fe or a Cu—Fe alloy, and an injection or stamping technique is used to make the reflective substrate 9 form the reflective cups 18a, 18b and 18c, the reflective surface 20 and the joints 25 that combine the reflective surface 20 and the substrate 9. The reflective surface 20 and the surface of the substrate 9 together form a shield for covering the reflective cups 18a, 18b and 18c. An injection molding or injection gel molding process is then performed to form a transparent body or gel injection shell 15, which covers the entire reflective substrate 9 and the LED chip, and further to form a single lens in front of the opening.

The wire bonding of the LED chip connects to four electric bars for electric connection 19 to the outside. The four electric bars 27 are pointed in the same direction.

Figure 7:
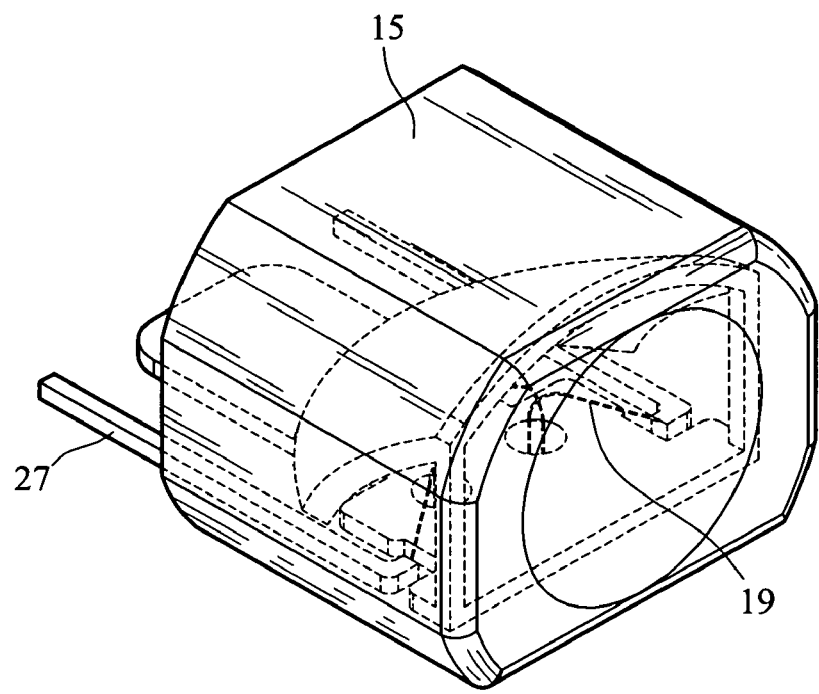
FIGS. 7 and 8 show the LED packages that have two electric bars and six electric bars, respectively, according to the second preferred embodiment.
Figure 8:
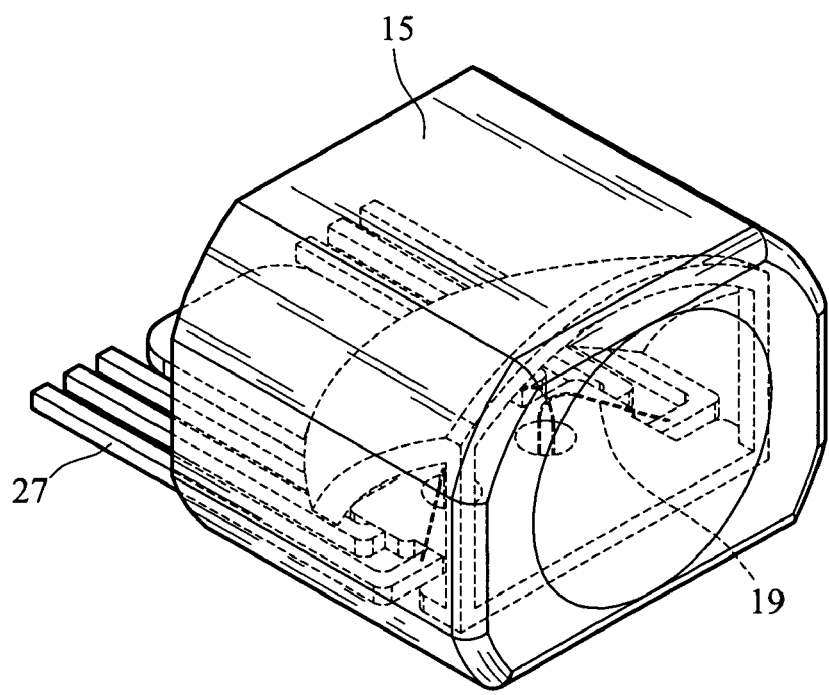

In addition, although four electric bars are used as an example in the above embodiments, practically, they are not a limitation of the numbers of electric bars that can be used. For example, please refer to FIGS. 7 and 8. According to the second preferred embodiment, the LED package also can have two electric bars 27 or six electric bars 27.

Similarly, although the second preferred embodiment is used as an example in the previous paragraph, two electric bars and six electric bars also can apply to the first preferred embodiment and the third preferred embodiment.

According to the description above, it can be seen that there are two characterized technical steps in the invention. One is forming the reflective surface of the LED chip by directly bending the substrate. The other is using gel injection or injection molding processes to form a transparent body or gel injection shell for covering the substrate, and further to form a single lens in front of the opening. Therefore the process of making the LED package is simpler, more convenient and less expensive.

The process described above is accomplished by the design of the structure. In other words, it is the modification of structure that makes the process simpler and less expensive. Following are detail descriptions that accompany the drawings for the characterized structure of the invention.

Figure 9:
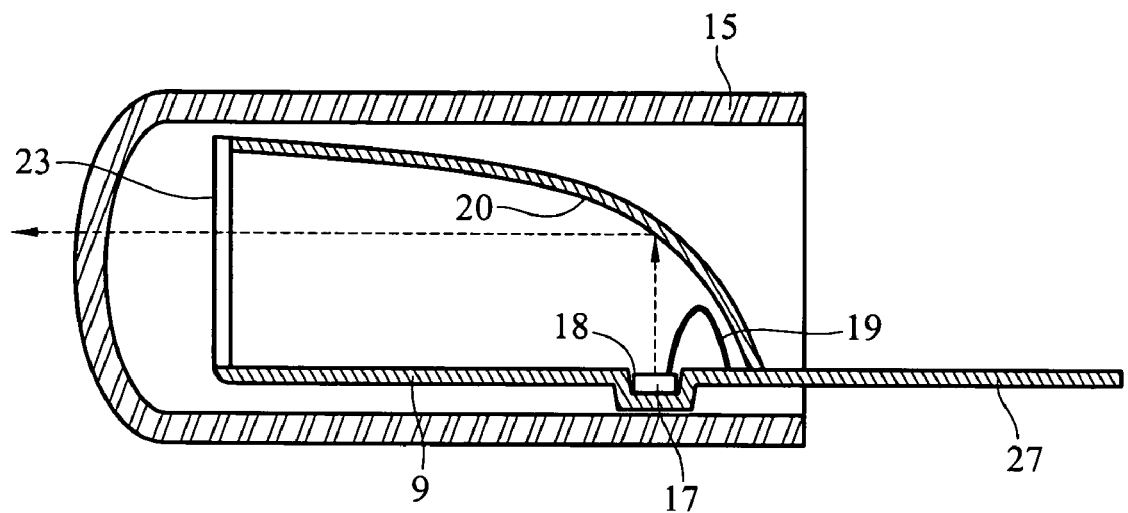
FIG. 9 shows the side view of the second preferred embodiment of the invention.

Please refer to FIG. 9, which shows the side view of the second preferred embodiment of the invention.

The LED package includes: a reflective substrate 9 with a reflective cup 18; an LED chip 17; and a transparent body or gel injection shell 15.

The reflective substrate 9 can be composed of metal or non-metal materials, which are conductive or non-conductive materials with good reflectivity, good ductility and good heat conductivity. The reflective substrate 9 comprises an opening and at least one reflective cup 18, and extends a reflective surface 20 that can be bended and is light reflective. Because the reflective substrate 9 is made of ductile metal, it can be bent backward to form a shield with the opening 23 and the surface of the substrate 9 for accommodating the reflective cups 18 of the LED chips. The purpose of the opening 23 is to emit light that is reflected, so the design of the opening 23 depends on the angle of the reflective light. The opening 23 and the reflective cup 18 can be formed by stamping or injection molding.

In addition, the reflective substrate 9 can electrically connect to the wire bonding of the LED chip 17 or form an electric pattern thereon for electrically connecting the LED chip 17.

One or more LED chips 17 can be disposed in the reflective cup 18 of the reflective substrate 9, the chips can comprises the p-n junction forms on a semiconductor substrate composed of AlGaAs, AlGaInP, GaP or GaN. et, al.

The selection of the semiconductor depends on the desire wavelength of emitted light.

Except for the examples disclosed above, any appropriate LED chip recognized by a person skilled in the art can also be used. In other words, the invention is not limited by the LED chip described above.

Figure 10:
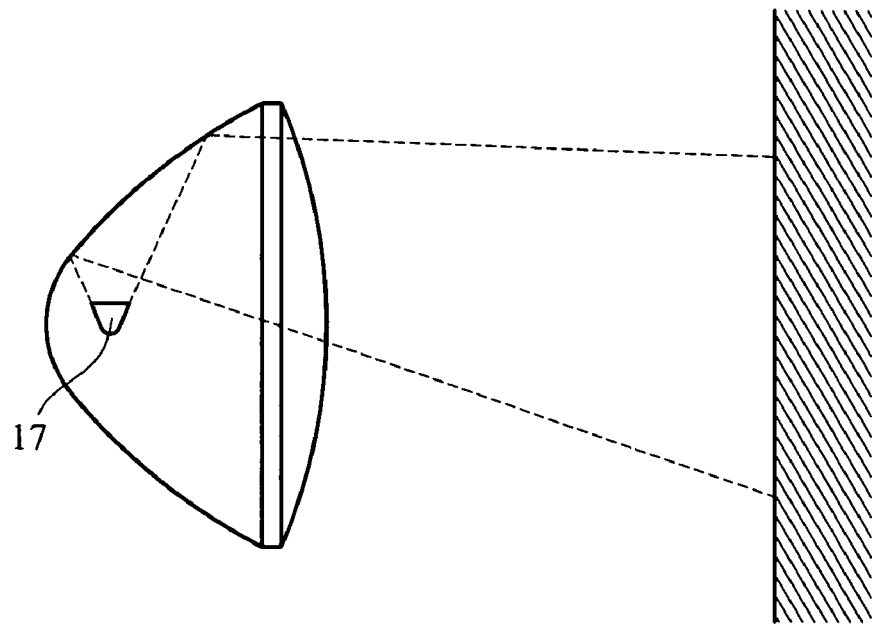
FIG. 10 shows the light simulation diagram of the second preferred embodiment of the invention.

The transparent body or gel injection shell 15 can be formed to cover the entire reflective substrate 9, including the reflective cups and the upper and lower surfaces of reflective substrate 9. The transparent body or gel injection shell 15 can be made of transparent epoxy, silica gel or the equivalent. Because the transparent body or the gel injection shell 15 is pervious to light and is used to form a lens in front of the opening, the material and curvature can be modified according to the desired amount of light in the LED package. For example, FIG. 10 shows a light simulation diagram of the structure.

According to the invention, the bending radian of the reflective substrate depends on the positions of the LED chip and parallel light desired. That is, the parameters of the radian for bending the reflective substrate and the parameters of placing the LED chip are designed and modified according to the desired parallel light.

Figure 11:
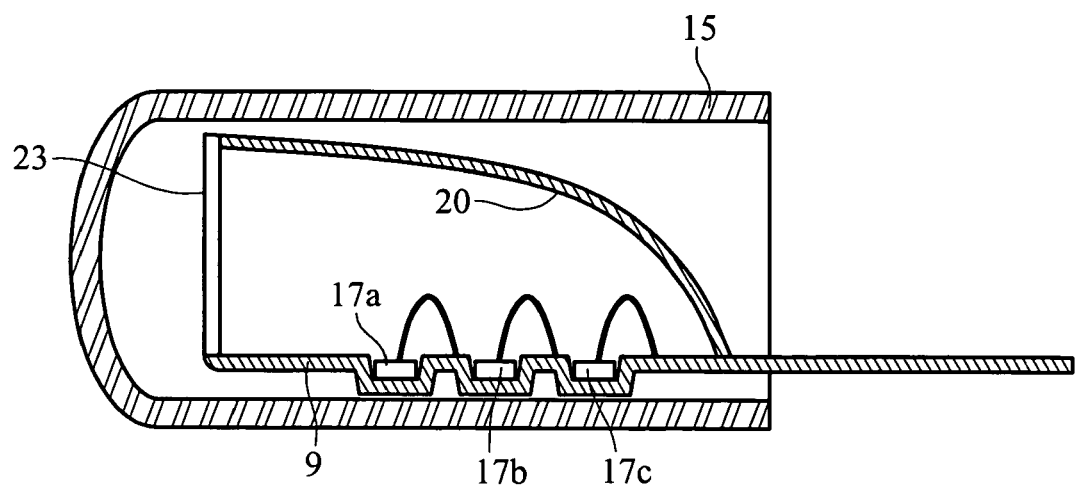
FIG. 11 shows a side view of another preferred embodiment of the LED package according to the invention.

Please refer to the FIG. 11, which shows a side view of another preferred embodiment of the LED package according to the invention.

The LED package comprises three groups of LED chips (one or more than one) 17a, 17b and 17c. That is, there are three LED chips 17a, 17b and 17c in reflective cups 18a, 18b and 18c in a shield, which is composed of the bending reflective surface 20 of the reflective substrate and the reflective substrate's surface. The three LED chip groups 17a, 17b and 17c, for example, can emit red, blue and green light separately and produce good tinges of white light by using the bending reflective surface 20 to reflect and mix the lights in the structure.

Although this preferred embodiment uses three LED chips or chip groups in a package as an example, practically, the number of LED chips can be increased or reduced as needed.

Figure 12:
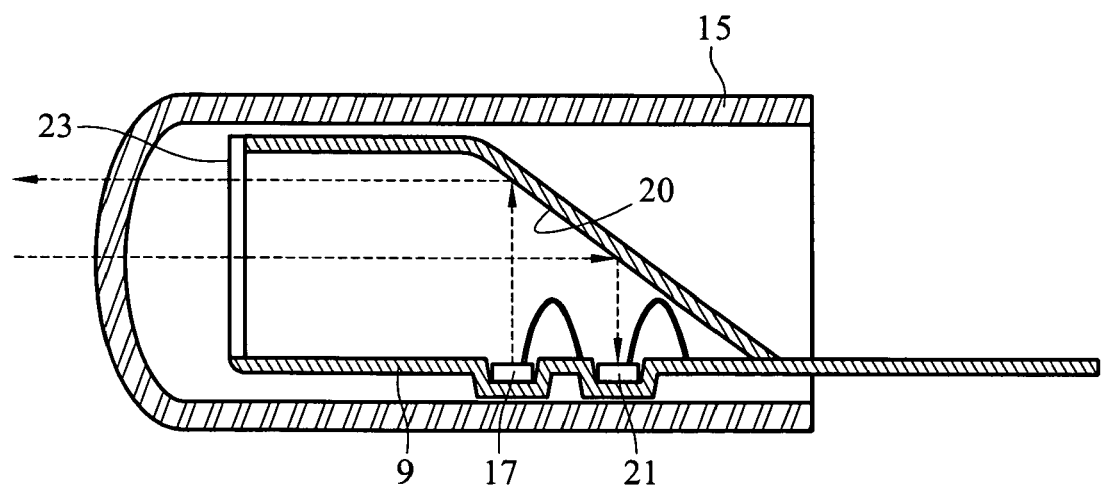
FIG. 12 shows a side view of another preferred embodiment of the LED package according to the invention.

Please refer to the FIG. 12, which shows a side view of another preferred embodiment of the LED package according to the invention.

The LED package in this example is used in the DVD read head application. The LED package includes LED chips 17 and a receiver 21. That is, there is an LED chips 17 and a receiver 21 in the reflective cups 18a and 18b. The light produced by the LED chips 17 can be reflected by the bending surface 20 of the reflective substrate, which results in parallel light. Furthermore, the incident parallel light can be reflected by the bending surface 20 of the reflective substrate, which is received by the receiver 21.

Figure 13:
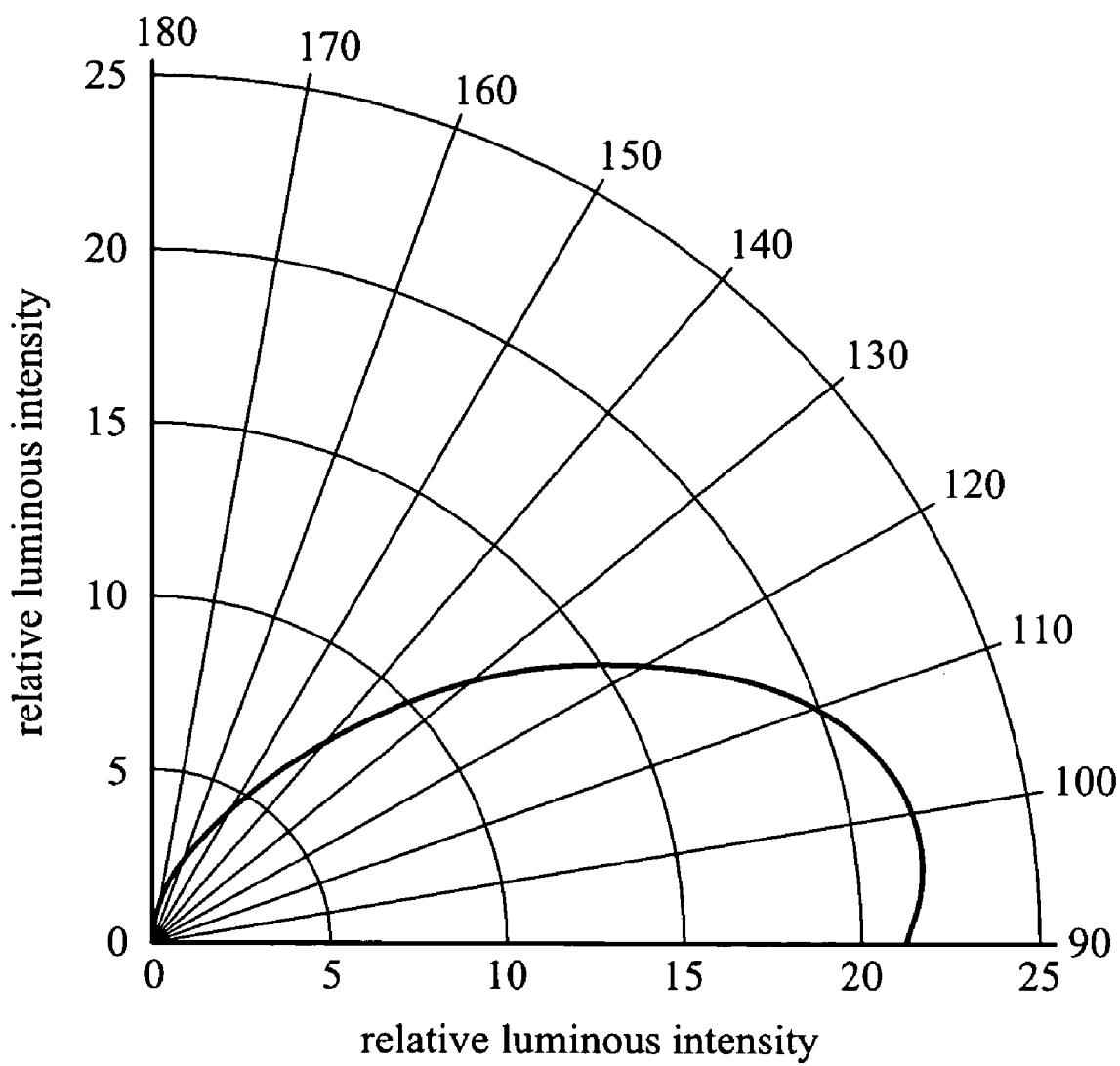
FIG. 13 shows the simulation diagram of light distribution of the LED package according to the invention.

Please refer to the FIG. 13, which shows a simulation diagram of light distribution of the LED package according to the invention.

According to the simulation drawing, the light produced according to the invention is distributed below 0 degrees. Therefore, there is no need for a light shield, which is necessary in conventional headlight or tail-light techniques for limiting the light distribution region. Thus the cost of additional light shielding is not needed and a better or equal performance can be achieved more efficiently.

From the description above, an LED package can be easily obtained by the process of directly bending the substrate to form a reflective surface, and the process of conventional gel injection. Therefore, it has the advantages of a simple process and reduced cost. In addition, because the reflective surface makes the LED chip able to emit parallel light, the additional light shield is unnecessary. The problem of the reflective element falling off can be solved by directly bending the substrate to form the reflective surface, therefore improving the strength of the structure. Moreover, when this structure is used to accommodate several LEDs for mixing lights, a good light mixing performance can be obtained.

Thus, the invention can apply to headlight, taillight, backlight or DVD read head industries.

Although the invention has been described with reference to specific embodiments, this description is not meant to be construed in a limiting sense. Various modifications of the disclosed embodiments, as well as alternative embodiments, will be apparent to persons skilled in the art. It is, therefore, intended that the appended claims will cover all modifications that fall within the scope of the invention.

What is claimed is:

1. A light emitting diode (LED) package, comprising:
    a reflective substrate having at least one reflective cup and a plurality of joints;
    a reflective surface, combined with the reflective substrate by the joints to form a shield for covering the reflective cup, the reflective substrate and the reflective surface provide an acute angle to form an opening, and the acute angle being created at the connection portion between the reflective surface and the reflective substrate;
    at least one LED chip, which is disposed in the reflective cup; and
    a transparent body or a gel injection shell which substantially covers the reflective substrate, the reflective surface, and the LED chip and further forms a lens in front of the opening.

2. The package of claim 1, wherein the reflective substrate is consisted of a metal material or ceramic materials.

3. The package of claim 1, wherein the reflective substrate bends in a curve shape.

4. The package of claim 1, wherein the transparent body or the gel injection shell is selected from one group consisted of a transparent epoxy, a silica gel and a transparent material with refractive index above 1.3, 1.4, 1.5 or 1.6.

5. The package of claim 1, further comprising a receiver for receiving a light which reflects from a bending surface of the reflective substrate.

6. The package of claim 1, wherein the reflective surface reflects light emitted from the LED chip toward the opening.

7. The package of claim 6, wherein the reflective surface is a curved surface.

* * * * *